United States Patent
Guhathakurta et al.

(10) Patent No.: US 12,075,704 B2
(45) Date of Patent: Aug. 27, 2024

(54) POLYMERIC PIEZOELECTRIC COMPOSITE COMPOSITIONS INCLUDING PASSIVE POLYMER MATRICES

(71) Applicant: SABIC Global Technologies B.V., Bergen op Zoom (NL)

(72) Inventors: Soma Guhathakurta, Karnataka (IN); Anantharaman Dhanabalan, Karnataka (IN); Venkata Ramanarayanan Ganapathy Bhotla, Karnataka (IN); Anshita Sudarshan, Bengaluru (IN)

(73) Assignee: SABIC Global Technologies B.V., Bergen op Zoom (NL)

( * ) Notice: Subject to any disclaimer, the term of this patent is extended or adjusted under 35 U.S.C. 154(b) by 1074 days.

(21) Appl. No.: 16/358,003

(22) Filed: Mar. 19, 2019

(65) Prior Publication Data
US 2020/0303621 A1    Sep. 24, 2020

(51) Int. Cl.
*H10N 30/853* (2023.01)
*C08F 220/18* (2006.01)
*C08F 220/28* (2006.01)
*C08K 3/22* (2006.01)
*C08K 5/521* (2006.01)
*H10N 30/857* (2023.01)

(52) U.S. Cl.
CPC ....... *H10N 30/8536* (2023.02); *C08F 220/18* (2013.01); *C08F 220/28* (2013.01); *C08K 3/22* (2013.01); *C08K 5/521* (2013.01); *H10N 30/857* (2023.02); *C08F 220/1804* (2020.02); *C08F 220/281* (2020.02); *C08F 220/285* (2020.02); *C08K 2003/2206* (2013.01); *C08K 2003/2237* (2013.01)

(58) Field of Classification Search
None
See application file for complete search history.

(56) References Cited

U.S. PATENT DOCUMENTS

| | | | |
|---|---|---|---|
| 4,624,796 A | 11/1986 | Giniewicz et al. | |
| 5,043,622 A * | 8/1991 | Sagong ................ | H10N 30/852 29/25.35 |
| 5,951,908 A | 9/1999 | Cui et al. | |
| 9,120,934 B2 * | 9/2015 | Tsai ......................... | C09D 4/06 |

(Continued)

FOREIGN PATENT DOCUMENTS

| | | | |
|---|---|---|---|
| EP | 2991153 A1 | 3/2016 | |
| FR | 2974807 A1 * | 11/2012 | ............... C08K 5/34 |

(Continued)

OTHER PUBLICATIONS

WO-2015098449-A1, Jul. 2015, Machine translation (Year: 2015).*
FR-2974807-A1, Nov. 2012, Machine translation (Year: 2012).*
Susan et al.; "Ion Gels Prepared by in Situ Radical Polymerization of Vinyl Monomers in an Ionic Liquid and Their Characterization as Polymer Electrolytes"; J. Am. Chem. Soc.; vol. 127; 2005; p. 4976-4983 (abstract only).

(Continued)

*Primary Examiner* — Satya B Sastri
(74) *Attorney, Agent, or Firm* — Womble Bond Dickinson (US) LLP

(57) ABSTRACT

Disclosed is a composite comprising: a polymer matrix formed from one or more of a monomer or a precursor polymer; and an in-situ dispersion of a piezoelectric ceramic filler and an ionic additive within the polymer matrix, wherein the composite exhibits a $d_{33}$ of at least 1 pC/N when measured using a piezoelectric meter. Disclosed also herein are methods of forming the composite.

15 Claims, 4 Drawing Sheets

(56) References Cited

U.S. PATENT DOCUMENTS

| | | | |
|---|---|---|---|
| 10,056,542 B2* | 8/2018 | Aliane | H04R 17/00 |
| 2008/0006795 A1* | 1/2008 | Khatua | C09C 1/36 |
| | | | 252/500 |
| 2011/0269919 A1 | 11/2011 | Min et al. | |
| 2013/0026411 A1* | 1/2013 | Jenninger | H10N 30/098 |
| | | | 29/25.35 |
| 2016/0329567 A1 | 11/2016 | Lee et al. | |
| 2017/0018700 A1* | 1/2017 | Miyoshi | H10N 30/045 |
| 2017/0066955 A1* | 3/2017 | Chen | C09K 5/14 |
| 2017/0373243 A1* | 12/2017 | Ozawa | B06B 1/0607 |
| 2019/0181330 A1* | 6/2019 | Tanabe | C01G 33/006 |
| 2019/0284423 A1* | 9/2019 | Bodkhe | H01L 41/193 |
| 2019/0334078 A1* | 10/2019 | Araujo Da Silva | H01L 41/193 |

FOREIGN PATENT DOCUMENTS

| | | | | |
|---|---|---|---|---|
| KR | 2011-0065166 A | 6/2011 | | |
| WO | WO 2012/176570 A1 | 12/2012 | | |
| WO | WO 2014/054919 A1 | 4/2014 | | |
| WO | WO-2015098449 A1 * | 7/2015 | | C08F 2/44 |
| WO | WO-2016157092 A1 * | 10/2016 | | C01G 33/00 |

OTHER PUBLICATIONS

Borodzyulya et al.; "Effect of conductivity on the dielectric characteristics of cyano-ethyl ester of poly(vinyl alcohol)"; Physics of the Solid State; vol. 55; Aug. 2013; p. 1647-1650 (abstract only).

M.D. Donato, Ph.D.; "Development of composite piezoelectric materials for tactile sensing"; Politecnico di Torino; Thesis; 2014; 95 pages.

Kim et al.; "Preparation of Functionalized Polysilsesquioxane and Polysilsesquioxane-Metal Nanoparticle Composite Spheres"; Macromol. Rapid Commun.; vol. 27; Aug. 2006; p. 1247-1253 (abstract only).

Kumar et al.; "Dielectric Properties of Polymethylmethacrylate/Barium Titanate (PmMA/BaTiO3) Nanocomposites"; Applied Polymer Composites; vol. 1; 2013; p. 47-56 (abstract only see 4$^{th}$ entry).

Xie et al.; "Core-shell structured poly(methyl methacrylate)/BaTiO3 nanocomposites prepared by in situ atom transfer radical polymerization: a route to high dielectric constant materials with the inherent low loss of the base polymer"; Journal of Materials Chemistry; vol. 21; 2011; p. 5897-5906 (abstract only).

Huang et al.; "Core@Double-Shell Structured Nanocomposites: A Route to High Dielectric Constant and Low Loss Material"; ACS Appl. Mater. Interfaces; vol. 8; 2016; p. 25496-25507.

* cited by examiner

POLYMERIC PIEZOELECTRIC COMPOSITE COMPOSITIONS INCLUDING PASSIVE POLYMER MATRICES

TECHNICAL FIELD

The disclosure concerns piezoelectric composites, and in particular polymeric piezoelectric composites having improved piezoelectric properties.

BACKGROUND

Piezoelectric materials are useful across a number of applications such as consumer electronics, healthcare, transportation (aviation), etc. Most of the commercial applications of piezoelectric materials are based on piezoelectric ceramics, such as lead zirconate titanate (PZT). However, piezoelectric ceramics are typically heavy, brittle and pose some challenges such as requirement of high temperature processing and expensive manufacturing capabilities for thin film fabrication. Efforts towards mechanically flexible piezoelectric materials have led to the discovery of piezoelectricity in ductile polymers such as poly(vinylidene fluoride) (PVDF). Such PVDF based polymeric piezoelectric materials provide improved flexibility, but they exhibit a lower piezoelectric response when compared to the ceramics.

Most conventional (0-3) piezoelectric polymer composites are fabricated by mixing a piezoelectric ceramic powder with a preformed polymer (ex-situ technique) either by dispersing in a solvent or via melt compounding. U.S. Pat. No. 5,951,908 describes (0-3) piezoelectric polymer composites that are formed by mixing a piezoelectric ceramic powder and various thermoplastic polymers in a solvent. A piezoelectric charge coefficient ($d_{33}$) as high as 64 picocoulombs per Newton (pC/N) was obtained with polymeric piezoelectric composite using PVDF as host polymer and calcium modified lead titanate as filler. U.S. Patent Publication No. 2017/0018700 A1 describes a (0-3) piezoelectric polymer composite with reasonably high $d_{33}$ (i.e., about 89 pC/N) prepared by solvent casting. The host polymer, cyanoethylated polyvinyl alcohol has high dielectric constant (about 20) and high dielectric loss (about 0.1-0.15).

U.S. Pat. No. 4,624,796 describes fabrication of (0-3) piezoelectric polymer composites including a ceramic and Ecogel polymer which is classified as superabsorbent of water and has exceptional water retention capacity, as a result, such polymeric piezoelectric composites are highly moisture sensitive. "Development of composite piezoelectric materials for tactile sensing", (Ph. D thesis, 2014) has described the fabrication and evaluation of (0-3) composites based on barium titanate in polymethyl methacrylate as a host polymer. Despite of high filler loading (about 50 vol. %), the maximum value of $d_{33}$ did not exceed 5 pC/N.

These and other shortcomings are addressed by aspects of the disclosure.

SUMMARY

The disclosure relates to a composite comprising: a polymer matrix formed from one or more of a monomer or a precursor polymer; and a dispersion of a piezoelectric ceramic filler and an ionic additive within the polymer matrix, wherein the polymer is synthesized in-situ.

The disclosure also relates to methods of forming the disclosed composites as well as articles formed therefrom.

DETAILED DESCRIPTION OF ILLUSTRATIVE EMBODIMENTS

Figure 1:
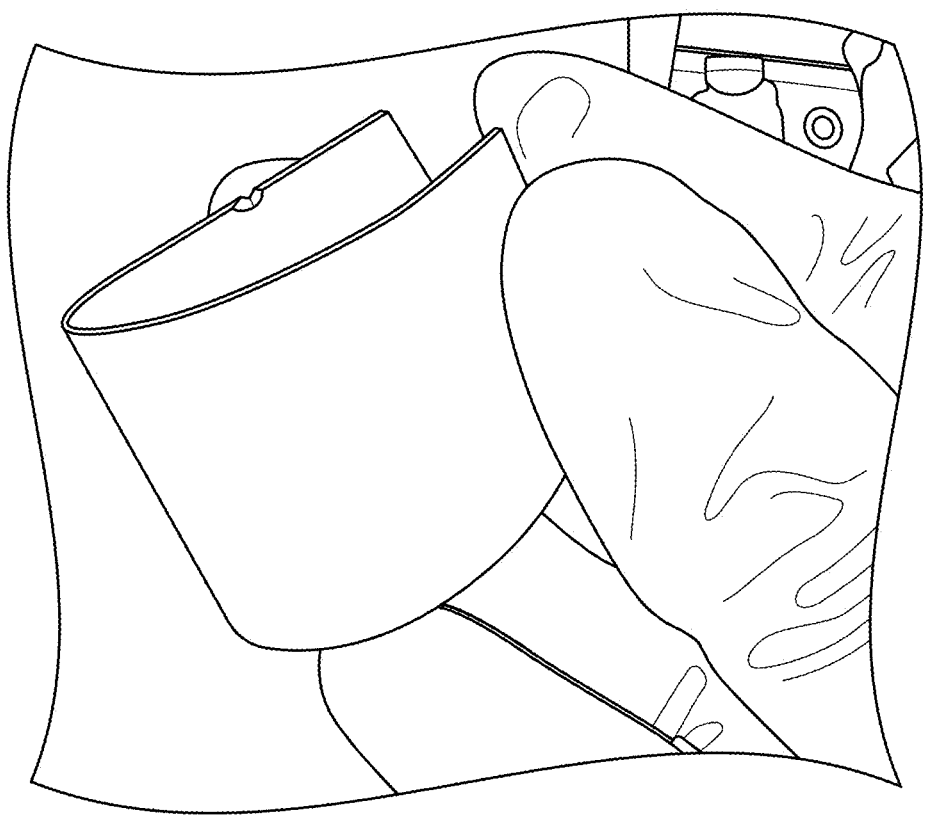
FIG. 1 shows a photograph of a polymeric piezoelectric composite film having 30 wt % barium titanate (BT) loading, in accordance with the aspects of present disclosure.
Figure 2B:
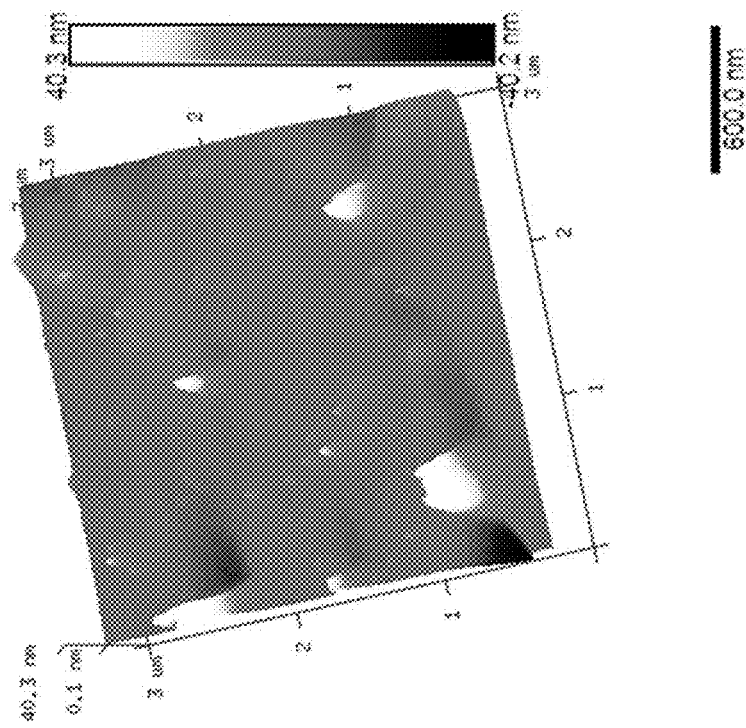
FIGS. 2A-2D shows atomic force microscopy (AFM) height images and scanning electron micrograph of the polymeric piezoelectric composites (Example 1—2A, 2C; Example 7—2B, 2D).
Figure 2A:
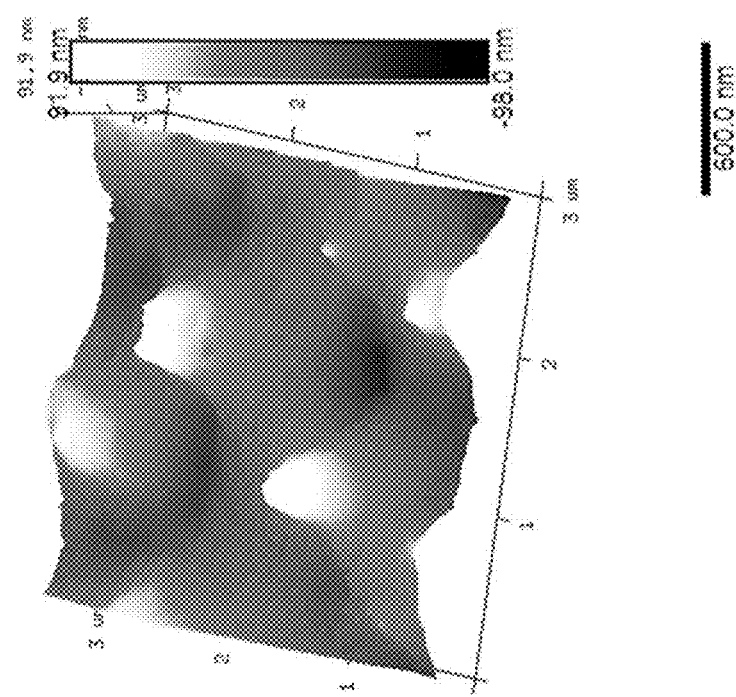
Figure 2D:
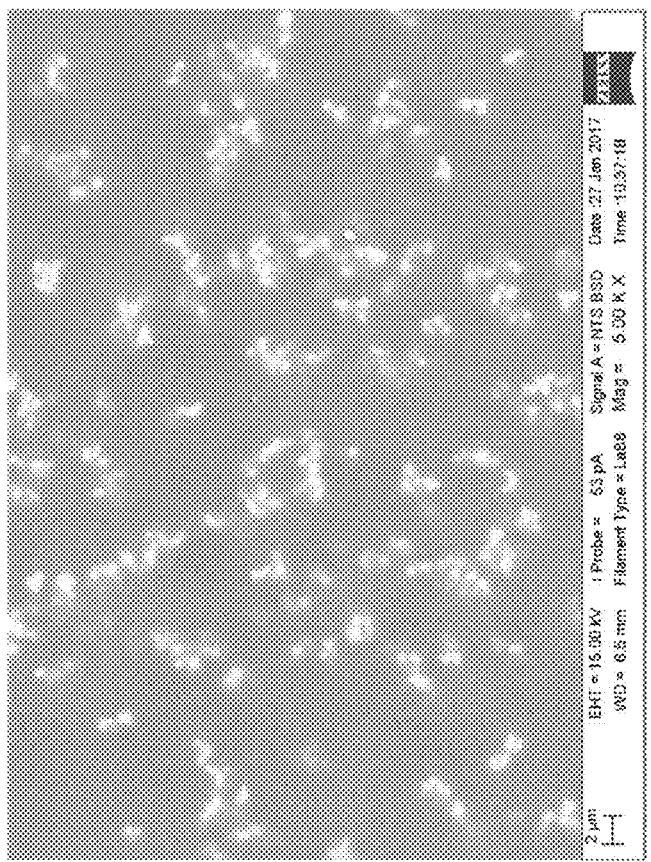
Figure 2C:
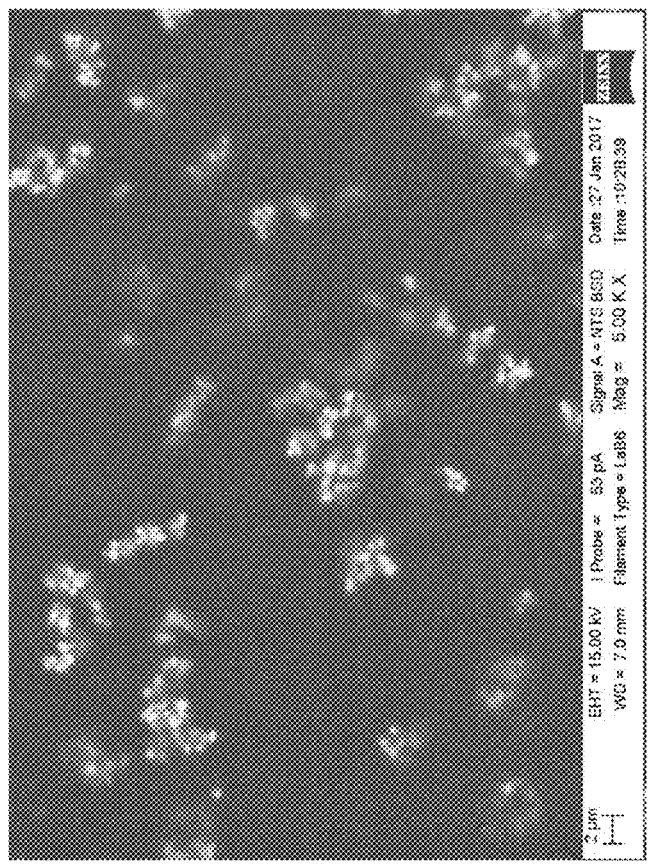

Piezoelectric materials are key components for electromechanical transducers (including sensors and actuators). Accordingly, these materials are useful across a number of applications such as consumer electronics, healthcare, transportation (aviation) etc. Piezoelectric materials are key components of electromechanical transducers (sensors and actuators) for automatic control systems, as well as measurement and monitoring systems.

Most of the commercial applications of piezoelectric materials are based on piezoelectric ceramics, such as lead zirconate titanate (PZT). Despite the fact that these piezoelectric ceramics are heavy, brittle and pose a variety of challenges, such as lead toxicity, low achievable strain under external electric field, as well as difficult and expensive processability. In addition, severe processing conditions, such as high temperatures (>500° C.) used to process inorganic piezoelectric materials into thin layers onto substrates, limits the choice of substrate materials. Further, piezoelectric ceramics are difficult and expensive to produce on a commercial scale. Efforts towards mechanically flexible piezoelectric materials have led to the discovery of piezoelectricity in ductile polymers such as poly(vinylidene fluoride) (PVDF). Such piezoelectric polymers offer several advantages. These advantages include mechanical flexibility, light weight, low processing temperatures, and ease of processing to achieve complex shapes. Still, despite such advantages over ceramic materials, the piezoelectric polymers suffer from lower piezoelectric response compared to piezoelectric ceramics, and further require a high electric field.

The piezoelectric charge coefficient t $d_{33}$ of PVDF is about 13-28 pC/N, while that of piezoelectric ceramic PZT is significantly higher and ranges from 270-400 pC/N). PVDF is a semicrystalline polymer; which is polymorphic in nature, having four crystal phases ($\alpha$, $\beta$, $\gamma$, $\delta$), out of which the polar $\beta$ phase is responsible for piezoelectricity. For a free-standing PVDF film, the $\beta$ crystal phase may be obtained by mechanical stretching, which cannot be used in conjunction with film deposition on a substrate. The use of polar solvents for casting thin films on a substrate could lead to the PVDF $\beta$ phase; but, these films are only stable at low drying temperatures (specifically, less than 50° C.), and such low drying temperatures may lead to porous films with poor electrical properties. Thus, as noted herein a vinylidene fluoride based piezoelectric polymer may solve some of the problems posed by the piezoelectric ceramics by offering mechanical flexibility and ease of processing, but may still be accompanied by drawbacks. Such vinylidene fluoride based piezoelectric polymers may be limited by their low piezoelectric response and requirement for high input voltage.

Accordingly, polymeric piezoelectric composites are attractive alternatives as these composites combine the advantages of both piezoelectric ceramics and polymers described herein. That is, the disclosed polymeric piezoelectric composites may combine high piezoelectric response, and high dielectric constant of ceramics with the mechanical flexibility of the polymers. Moreover, the piezoelectric response and the other properties can be fine-tuned for various applications via changing the type, composition ratio, shape and connectivity of inorganic piezoelectric fillers, by altering the polymer forming the matrix. Incorporation of piezoelectric ceramic fillers in vinylidene fluoride based polymers (homo-, co-, and terpolymers) and rubbers to form (0-3) composites have led to higher $d_{33}$ constant (about 40-60 pC/N). However, it is difficult to achieve good piezoelectric performance with (0-3) polymeric piezoelectric composite film based on mechanically brittle, passive polymers (does not respond under electric field). Dispersion of inorganic ceramic particles in these polymers may create weak filler-polymer interfaces which in turn reduces the piezoelectric and mechanical performance.

Among the various requirements described above, the disclosed composites provide: 1) a reasonably good piezoelectric constant with a passive polymer as matrix, 2) thin film forming ability, both free-standing and supported film on the substrate, 3) simple and environmentally friendly process of making the polymeric piezoelectric composites from commercially available monomers, and 4) low temperature processability.

In various aspects, the present disclosure may provide in-situ dispersion of piezoelectric ceramic fillers in passive amorphous thermoplastic vinyl polymer matrix, with the aid of an ionic additive. More specifically, the present disclosure provides a polymeric piezoelectric composite composition comprising an inorganic piezo ceramic filler dispersed in a passive, amorphous, thermoplastic, vinyl polymer matrix, wherein the piezoelectric property of the composition can be further tuned by incorporation of an ionic additive compatible with the vinyl monomer(s) and polymer, wherein concentration of ionic additive is below 5 wt %, and or using a vinyl comonomer capable of forming hydrogen bonded network. Passive as used to describe the nature of the vinyl polymer matrix may refer to a property of the matrix in contrast to electroactive polymers which show ion activated or field activated deformation. Passive vinyl monomers may not exhibit ion activated or field activated deformation.

The piezoelectric polymer composite compositions are prepared by in-situ dispersion of piezoelectric ceramic filler and ionic additive in vinyl monomer(s) or precursor polymer. The composite may be subjected to appropriate poling process and conditions. As provided herein, the ionic additive may comprise an organic cation and a balancing anion and the monomer or polymerizable precursor may comprise at least one polymerizable vinyl monomer and a polymerizable constituent. The polymerizable constituent may comprise a polymerizable co-monomer, a crosslinking agent, or both a polymerizable comonomer and a crosslinking agent; wherein the precursor polymeric piezoelectric composite comprises a polymer matrix, the ionic liquid, a piezoelectric ceramic filler, unreacted polymerizable vinyl monomer, and optionally unreacted polymerizable co-monomer; and the polymer matrix comprises polymerized vinyl monomer and optionally polymerized co-monomer. The polymerizable co-monomer may comprise at least one functional group that has the ability to form hydrogen bonds within the polymer matrix. The crosslinking agent covalently crosslinks the polymer matrix. In some aspects, the polymeric piezoelectric composite may comprise the polymer matrix, the piezoelectric ceramic filler, the ionic liquid, and less than about 10 ppm of unreacted polymerizable vinyl monomer and unreacted polymerizable co-monomer, based on the total weight of the polymeric piezoelectric composite. Any amount of unreacted polymerizable vinyl monomer and unreacted polymerizable co-monomer in the polymeric piezoelectric composite may be measured via high performance liquid chromatography (HPLC). The ionic liquid may be compatible or partially compatible with the polymer matrix; and the concentration of the ionic liquid in the dielectric polymer composition ranges from about 0.5 wt. % to about 30 wt. %.

The various key features disclosed in the present disclosure may include: solution and melt processable polymeric piezoelectric composites, commercial availability of monomers, formation of a self-standing film formed by simple and environmentally friendly process (solvent free), scalability, capability to form piezoelectric layer of desired thickness at a low temperature (about 60° C.), deposition of polymeric piezoelectric composite on a substrate, tunability of adhesion to substrate, and ease of poling of polymeric piezoelectric composite film.

The present disclosure can be understood more readily by reference to the, examples, drawings, and claims described herein. It is to be understood that this disclosure is not limited to the specific thermoplastic compositions, articles, devices, systems, and/or methods disclosed unless otherwise specified, as such can, of course, vary. It is also to be understood that the terminology used herein is for the purpose of describing particular aspects only and is not intended to be limiting. Those of ordinary skill in the relevant art will recognize and appreciate that changes and modifications can be made to the various aspects of the disclosure described herein, while still obtaining the beneficial results of the present disclosure. It will also be apparent that some of the desired benefits of the present disclosure can be obtained by selecting some of the features of the present disclosure without utilizing other features. The present description is provided as illustrative of the principles of the disclosure and not in limitation thereof. Various combinations of elements of this disclosure are encompassed by this disclosure, e.g., combinations of elements from dependent claims that depend upon the same independent claim.

Definitions

All publications mentioned herein are incorporated herein by reference to, for example, describe the methods and/or materials in connection with which the publications are cited.

It is also to be understood that the terminology used herein is for the purpose of describing particular aspects only and is not intended to be limiting. As used in the specification and in the claims, the term "comprising" may include the aspects "consisting of" and "consisting essentially of" Unless defined otherwise, all technical and scientific terms used herein have the same meaning as commonly understood by one of ordinary skill in the art to which this disclosure belongs.

Unless otherwise specified, average molecular weights refer to weight average molecular weights ($M_w$) and percentages refer to weight percentages (wt. %) which, unless specifically stated to the contrary, are based on the total weight of the composition in which the component is included. In all cases, where combinations of ranges are provided for a given composition, the combined value of all components does not exceed 100 wt %.

Component materials to be used to prepare disclosed thermoplastic compositions of the disclosure as well as the thermoplastic compositions themselves to be used within methods are disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. This concept applies to all aspects of this application including, but not limited to, steps in methods of making and using the thermoplastic compositions of the disclosure.

References in the specification and concluding claims to parts by weight, of a particular element or component in a composition or article denotes the weight relationship between the element or component and any other elements or components in the composition or article for which a part by weight is expressed. Thus, in a composition containing 2 parts by weight of component X and 5 parts by weight component Y, X and Y are present at a weight ratio of 2:5, and are present in such ratio regardless of whether additional components are contained in the compound.

Compounds disclosed herein are described using standard nomenclature. For example, any position not substituted by any indicated group is understood to have its valency filled by a bond as indicated, or a hydrogen atom.

As used herein, the terms "number average molecular weight" or "Mn" can be used interchangeably, and refer to the statistical average molecular weight of all the polymer chains in the sample and is defined by the formula:

$$M_n = \frac{\sum N_i M_i}{\sum N_i},$$

where $M_i$ is the molecular weight of a chain and $N_i$ is the number of chains of that molecular weight. $M_n$ can be determined for polymers, e.g., polycarbonate polymers, by methods well known to a person having ordinary skill in the art using molecular weight standards, e.g., polycarbonate standards or polystyrene standards, preferably certified or traceable molecular weight standards.

As used herein, the terms "weight average molecular weight" or "Mw" can be used interchangeably, and are defined by the formula:

$$M_w = \frac{\sum N_i M_i^2}{\sum N_i M_i},$$

where $M_i$ is the molecular weight of a chain and $N_i$ is the number of chains of that molecular weight. Compared to $M_n$, $M_w$ takes into account the molecular weight of a given chain in determining contributions to the molecular weight average. Thus, the greater the molecular weight of a given chain, the more the chain contributes to the $M_w$. $M_w$ can be determined for polymers, e.g. polycarbonate polymers, by methods well known to a person having ordinary skill in the art using molecular weight standards, e.g. polycarbonate standards or polystyrene standards, preferably certified or traceable molecular weight standards.

In further aspects, compatibility of the ionic liquid with the polymeric matrix may be defined according to the effect of the ionic liquid on surface roughness of piezocomposite film. For example, an ionic liquid that is compatible with polymer may provide significant lowering of surface roughness of piezocomposite film. Conversely, where the ionic liquid is incompatible with the polymeric matrix, its effect on surface roughness may not be as prominent or apparent.

The term "dielectric" as used herein, generally refers to the property of transmitting electric force without conduction. Dielectric indicates the energy soring capacity of a given material. The dielectric constant (Dk) is a quantity that measures the ability of a given substance to store electric energy in an electric field. As an example, the Dk may be measured according to a parallel plate capacitor method, such as using an Agilent 4263B LCR meter (Japan) at 1 V and 1 kHz.

As used herein, the term "in-situ polymerization" refers to polymerization in the reaction mixture, for example polymerization of vinyl monomers in the presence of an ionic liquid and piezoelectric ceramic filler in the reaction mixture.

As used herein, the term "in-situ dispersion" refers to the dispersion of piezoelectric ceramic filler and ionic additive in a vinyl monomer(s) or precursor polymer prior to polymerization.

As used herein, "miscible" or "fully miscible" may refer to two or more fluids that when mixed in any proportions yield a homogeneous solution or mixture (as opposed to a phase separated solution or mixture). Miscible may also describe when the two or more fluids have infinite solubility in each other. Two or more fluids are partially miscible when they can only be mixed in certain proportions to yield a homogeneous solution or mixture (as opposed to a phase separated solution or mixture); while any other proportions would yield a phase separated solution or mixture.

As used herein, "free standing films" may refer to self-standing films, that is, films having no support.

They are casted on substrate and peeled off after drying.

As used herein, the term "plasticization" refers to the ionic liquid molecules being incorporated between polymeric chains, as a result of which chain slippage can happen, resulting in the free volume of the system (i.e., polymeric piezoelectric composite and/or precursor dielectric polymeric composition) increasing, which in turn can be manifested by a lowering of $T_g$.

As used herein, "passive polymer matrix" may refer to a polymer matrix which does not undergo deformation under the influence of an electric field.

"Surface roughness" may be quantitatively presented as RRMS which is the Root Mean Square of a given surface's measured microscopic peaks and valleys.

The term "actuator," refers to a material that converts electric energy to mechanical energy in response to an electric potential. The term "sensor" with respect to a piezoelectric material refers to a material that converts mechanical energy into electrical energy in response to a mechanical force.

The term "piezoelectric constant" ($d_{33}$) as used herein, refers to the polarization generated per unit of mechanical stress (T) applied to a piezoelectric material or, alternatively, is the mechanical strain (S) experienced by a piezoelectric material per unit of electric field applied. The piezoelectric constant may also be referred to as the piezoelectric sensitivity of a given material.

The term "piezoelectric voltage constant" ($g_{33}$) as used herein, refers to the electric field generated by a piezoelectric material per unit of mechanical stress applied or, alternatively, is the mechanical strain experienced by a piezoelectric material per unit of electric displacement applied. The constant $g_{33}$ characterizes the sensitivity of a piezoelectric sensor. It can expressed as a function of a material thickness t, voltage applied V and applied stress T according to the following equation: $V=-(g_{33})(T)(t)$. By working with a range of V and T for a sample of specific geometry, it is possible to extract the $g_{33}$. Alternatively, $g_{33}$ may be derived from the $d_{33}$ and the normalized measured permittivity ($\varepsilon 33$) according to the following equation $g_{33}=d_{33}/\varepsilon_{33}$ for polymeric piezoelectric composites. The normalized measured permittivity $\varepsilon_{33}$ may be measured using a Dielectric Analyzer.

As used herein, an (0-3) piezoelectric polymer composite may refer to the designation of composites according to the connectivity of the ceramic and polymer components. The first digit corresponds to the connectivity in ceramic components and the second digit corresponds to the connectivity in polymer. According to this nomenclature, composites in which the piezoelectric ceramic particles are surrounded by a three dimensionally connected polymer phase have (0-3) connectivity.

In one aspect, "substantially free of" may refer to less than 0.5 wt. % or less than about 0.5 wt. % present in a given composition or component. In another aspect, substantially free of can be less than 0.1 wt. %, or less than about 0.1 wt. %. In another aspect, substantially free of can be less than 0.01 wt. %, or less than about 0.01 wt. %. In yet another aspect, substantially free of can be less than 100 parts per million (ppm), or less than about 100 ppm. In yet another aspect, substantially free can refer to an amount, if present at all, below a detectable level.

As used herein, "monomer" includes co-monomers.

As used herein, the term "vinyl monomer" (also known as "ethenyl monomer") may refer to compounds having ethenyl (e.g., substituted ethylene) functional groups capable of forming and reacting via free radicals, wherein such compounds having ethenyl functional groups comprise monomers, oligomers, polymers, or combinations thereof having one or more ethenyl functional groups capable of forming and reacting via free radicals.

As used herein, the term "polymerizable" monomer (e.g., polymerizable vinyl monomer) refers to a monomer having a functional group (e.g., an ethenyl functional group) capable of undergoing addition polymerization (e.g., free radical polymerization by successive addition of free radical building blocks). Non-limiting examples of ethenyl functional groups that can be present in the vinyl monomers disclosed herein include a vinyl group, an allyl group, an acrylate group, a styrene group, and the like, or combinations thereof.

As used herein, the term "polymerizable" precursor (e.g., polymerizable constituent, polymerizable monomer, polymerizable co-monomer, crosslinking agent, etc.) refers to a precursor to polymer that can be polymerized or otherwise incorporated into a polymer as disclosed herein.

As used herein, the term "(meth)acrylate" in a compound name refers to the compound comprising an acrylate, a methacrylate, or combinations thereof. For example, the term "mono-(meth)acrylates" refers to mono-acrylates, monomethacrylates, or both mono-acrylates and monomethacrylates.

As used herein, the term "(meth)acrylamide" in a compound name refers to the compound comprising an acrylamide, a methacrylamide, or combinations thereof. For example, the term "methylene bis-(meth)acrylamide" refers to methylene bis-acrylamide, methylene bis-methacrylamide, or both methylene bis-acrylamide and methylene bis-methacrylamide.

As used herein, glass transition temperature $T_g$ with respect to polymers (particularly amorphous polymers) may refer to a temperature region where a polymer transitions from a hard, glassy material to a soft, rubbery material.

As used herein, melting temperature $T_m$ with respect to polymers (particularly crystalline polymers) may refer to a temperature region where an ordered polymeric crystal structure becomes a disordered liquid.

As used herein, transparent, transparency, and their derivatives may refer to a level of transmission for a resin composition that is greater than 89%, including exemplary transmission values of at least 90%, at least 91%, at least 92%, at least 93%, at least 94%, at least 95%, or any range of transmission values derived from the above exemplified values. The disclosed piezocomposites may be opaque even at a low filler loading (for example, about 5 wt. %).

Polymer Matrix

Disclosed herein is a dispersion of piezoelectric ceramic fillers in a passive, amorphous thermoplastic vinyl polymer matrix, with the aid of an ionic additive, wherein the polymer is synthesized in-situ. The passive, amorphous thermoplastic vinyl polymer matrix may be derived from a monomer or polymerizable precursor. The monomer or polymerizable precursor may comprise at least one polymerizable vinyl monomer.

In an aspect, the monomer or polymerizable precursor can comprise at least one polymerizable vinyl monomer. As described herein, a vinyl monomer may be described as an as "ethenyl monomer" and may refer to compounds having ethenyl (e.g., substituted ethylene) functional groups capable of forming and reacting via free radicals. These compounds having ethenyl functional groups may comprise monomers, oligomers, polymers, or combinations thereof having one or more ethenyl functional groups that are capable of forming and reacting via free radicals. Non-limiting examples of ethenyl functional groups that may be present in the vinyl monomers disclosed herein include a vinyl group, an allyl group, an acrylate group, a styrene group, and the like, or combinations thereof.

In one example, the vinyl monomer may have the following structure I:

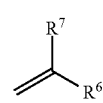

Structure I wherein $R^6$ is selected from the group consisting of hydrogen, an alkyl group, an aryl group, a substituted aryl group, an alkyl aryl group, a cyano group, and combinations thereof and wherein $R^7$ is selected from the group consisting of hydrogen, an alkoxycarbonyl group, an aryloxycarbonyl group, a carboxyl group, and combinations thereof.

Non-limiting examples of vinyl monomers suitable for use in the present disclosure may include styrene monomers, acrylonitrile monomers, acrylate monomers, diallyl phthalate monomer, divinyl succinate monomer, divinyl adipate monomer, divinyl phthalate monomer, derivatives thereof, and the like, or combinations thereof. The vinyl monomer may comprise styrene, acrylonitrile, derivatives thereof, or combinations thereof. For example, the vinyl monomer may comprise an acrylate monomer, such as an acrylate and/or methacrylate monomer.

In some aspects, the vinyl monomer may comprise a single vinyl monomer; such as an acrylate. In further aspects, the vinyl monomer may comprise two polymerizable vinyl monomers; such as styrene and acrylonitrile.

As an example, the vinyl monomer may comprise an acrylate monomer, wherein the acrylate monomer can have the following structure II:

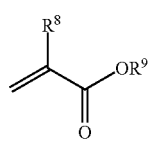

Structure II wherein $R^8$, and $R^9$ can each independently be hydrogen, a substituted or unsubstituted alkyl group, a substituted or unsubstituted aryl group, an alkyl aryl group, and the like, or combinations thereof.

Non-limiting examples of acrylate monomers suitable for use in the present disclosure include acrylic acid esters, methacrylic acid esters, hydroxy-functional acrylic acid esters, hydroxyfunctional methacrylic acid esters, and the like, or combinations thereof. The acrylate monomer may comprise mono-(meth)acrylates, mono-(meth)acrylates, di-(meth)acrylates, poly-(meth)acrylates, methyl (meth)acrylate, ethyl (meth)acrylate, isopropyl (meth)acrylate, n-hexyl (meth)acrylate, stearyl (meth)acrylate, allyl (meth)acrylate, 1,3-propanediol di(meth)acrylate, trimethylolpropane tri (meth)acrylate, 1,2,4-butanetriol tri(meth)acrylate, 1,4-cyclohexanediol di(meth)acrylate, sorbitol hex(meth)acrylate, tetrahydrofurfuryl (meth)acrylate, bis[1-(2-acryloxy)]-p-ethoxyphenyldimethylmethane, bis[1-(3-acryloxy-2-hydroxy)]-propoxyphenyldimethylmethane, trishydroxyethyl-isocyanurate tri(meth)acrylate, urethane (meth)acrylates; (meth)acrylamides (e.g., (meth)acrylamide, methylene bis-(meth)acrylamide, diacetone (meth)acrylamide); and the like; or combinations thereof.

The vinyl monomer may comprise an acrylate monomer (e.g., polymerizable acrylate monomer), wherein the acrylate monomer comprises methyl acrylate, ethyl acrylate, methacrylate, methyl methacrylate (MMA), butyl methacrylate, and the like, or combinations thereof. In some examples, the vinyl monomer may comprise methyl methacrylate (MMA).

In various aspects, the monomer or polymerizable precursor may comprise a single polymerizable vinyl monomer, such as, for example, a single type of polymerizable vinyl monomer). In further aspects, the monomer or polymerizable precursor may comprise two or more monomers (e.g., 2, 3, 4, 5, or more monomers), wherein the two or more monomers may be the same type of vinyl monomer or different types of vinyl monomers. For example, all monomers may be acrylates or all monomers may be styrenes; or some monomers may be styrenes, while other monomers can be acrylates.

Where the monomer or polymerizable precursor comprises more than one type of vinyl monomer, the monomer or polymerizable precursor may be a monomer blend (e.g., blended polymerizable precursor), such as a styrene and acrylonitrile blend; a styrene, acrylonitrile and methyl methacrylate blend; and the like; or combinations thereof.

The vinyl monomer may be present in the mixture to be subjected to in-situ polymerization conditions in an amount of from about 70 wt. % to about 99.5 wt. %, or from about 90 wt. % to about 99 wt. %, or from about 94 wt. % to about 96 wt. %. In some examples, the vinyl monomer may be present in the mixture to be subjected to in-situ polymerization conditions in an amount of about 95 wt. %.

According to various aspects, the monomer or polymerizable precursor may comprise a polymerizable constituent. The polymerizable constituent may comprise a polymerizable co-monomer, a crosslinking agent, or both a polymerizable co-monomer and a crosslinking agent. In an example, the polymerizable comonomer may comprise at least one functional group that has the ability to form hydrogen bonds within a polymer matrix. The polymerizable constituent may comprise a polymerizable co-monomer.

Without wishing to be bound to a particular theory, the at least one functional group of the polymerizable comonomer may have the ability to form hydrogen bonds with the vinyl monomer. In some aspects, the at least one functional group that has the ability to form hydrogen bonds comprises a polar functional group. Without wishing to be limited by a particular theory, the polar functional group of the co-monomer may improve uniform dispersion of the ionic liquid (also polar) within the vinyl monomer (and consequently within the polymer matrix), by rendering the polymer matrix more polar overall.

The at least one functional group that has the ability to form hydrogen bonds within the polymer matrix may be selected from the group consisting of a hydroxyl group, a carboxyl group, an amino group, an imino group, and combinations thereof. In further examples, the at least one functional group that has the ability to form hydrogen bonds within the polymer matrix comprises a hydroxyl group. For purposes of the disclosure herein, a polymeric piezoelectric composite comprising structural units derived from a polymerizable co-monomer having at least one functional group that has the ability to form hydrogen bonds within the polymer matrix can also be referred to as a "hydrogen bonded polymeric piezoelectric composite;" and the terms polymeric piezoelectric composite and hydrogen bonded polymeric piezoelectric composite may be used interchangeably.

In various aspects, the polymerizable co-monomer may be an acrylate monomer, such as a hydroxyalkyl methacrylate. For example, the polymerizable co-monomer may comprise 2-hydroxyethyl methacrylate (HEMA).

The co-monomer may be present in the monomer or polymerizable precursor in an amount of from about 5 wt. % to about 30 wt. %, from about 5 wt. % to about 15 wt. %, or from about 8 wt. % to about 12 wt. %. In such aspect, the vinyl monomer can be present in the monomer or polymerizable precursor in an amount of from about 70 wt. % to about 95 wt. %, from about 85 wt. % to about 95 wt. %, or from about 88 wt. % to about 92 wt. %. The co-monomer may be present in the monomer or polymerizable precursor in an amount of about 10 wt. % and the vinyl monomer can be present in the monomer or polymerizable precursor in an amount of about 90 wt. %.

In some aspects, the polymerizable constituent may comprise a crosslinking agent. Generally, crosslinking agents provide for the formation of chemical bonds, such as covalent bonds (such as, for example, covalent crosslinks) between polymeric chains within a polymer matrix. Without wishing to be limited to a particular theory, the crosslinking agent provides for a stable three dimensional polymer matrix.

The disclosed crosslinking agent may comprise tetraethylene glycol diacrylate (TEGDA), tetraethylene glycol dimethacrylate (TEGDMA), ethylene glycol dimethacrylate (EGDMA), diethylene glycol dimethacrylate (DEGDMA), hexamethylene glycol dimethacrylate (HMGDMA), polyethylene glycol diacrylate (PEGDA), polyethylene glycol dimethacrylate (PEGDMA), trimethylol propane triacrylate (TMPTA), and the like, or combinations thereof. In an example, the crosslinking agent can comprise tetraethylene glycol diacrylate (TEGDA). The crosslinking agent may be present in the mixture to be subjected to in-situ polymerization conditions in an amount of from about 0.1 wt. % to about 10 wt. %, or from about 1 wt. % to about 9 wt. %, or from about 4 wt. % to about 6 wt. %. The crosslinking agent may be present in the mixture to be subjected to in-situ polymerization conditions in an amount of about 5 wt. %.

The mixture to be subjected to in-situ polymerization conditions may further comprise a free radical initiator. Generally, free radical initiators are chemical compounds that generate a pair of free radicals, wherein the free radicals may react with the monomers and thus initiate the polymerization. The free radical initiator suitable for use in the present disclosure may be any initiator suitable for free radical polymerization reactions.

In one aspect, the free radical initiator can be selected from a group consisting of azobisisobutyronitrile, benzoyl peroxide, di-tert-butyl peroxide, tert-amyl peroxybenzoate, phenyl-azotriphenylmethane, cumyl peroxide, acetyl peroxide, lauroyl peroxide, tert-butylhydroperoxide, tert-butyl perbenzoate, and combinations thereof. The free radical initiator may comprise azobisisobutyronitrile.

The free radical initiator can be present in the mixture to be subjected to in-situ polymerization conditions in an amount of from about 0.01 wt. % to about 0.5 wt. %, or from about 0.05 wt. % to about 0.4 wt. %, or from about 0.1 wt. % to about 0.3 wt. %. In some aspects, the free radical initiator can be present in the mixture to be subjected to in-situ polymerization conditions in an amount of about 0.2 wt. %.

In some aspects, the polymer matrix comprises structural units derived from at least one polymerizable vinyl monomer. For example, the polymer matrix may comprise PMMA such that the polymer matrix comprises structural units derived from methyl methacrylate (MMA).

In further aspects, the polymer matrix can be a copolymer comprising structural units derived from two polymerizable vinyl monomers. In some aspects, the polymer matrix comprises structural units derived from styrene and structural units derived from acrylonitrile, wherein the polymer matrix can have Structure III:

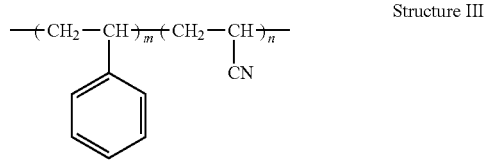

Structure III wherein the structural units derived from styrene (repeated m times) are present in the polymer matrix in an amount of from about 60 wt. % to about 90 wt. %, or from about 60 wt. % to about 80 wt. %, or from about 70 wt. % to about 80 wt. %, or from about 60 wt. % to about 75 wt. %; and the structural units derived from acrylonitrile (repeated n times) are present in the polymer matrix in an amount of from about 10 wt. % to about 40 wt. %, or from about 20 wt. % to about 40 wt. %, or from about 20 wt. % to about 30 wt. %, or from about 15 wt. % to about 40 wt. %.

The polymer matrix may comprise from about 70 wt. % to about 80 wt. %, or from about 71 wt. % to about 79 wt. %, or from about 72.5 wt. % to about 77.5 wt. % structural units derived from styrene, and from about 20 wt. % to about 30 wt. %, or from about 21 wt. % to about 29 wt. %, or from about 22.5 wt. % to about 27.5 wt. % structural units derived from acrylonitrile; and wherein the concentration of the ionic liquid in the polymeric piezoelectric composite ranges from about 1 wt. % to about 10 wt. %, or from about 4 wt. % to about 6 wt. %.

In yet further aspects, the polymer matrix may be a terpolymer comprising structural units derived from at least one polymerizable acrylate monomer (e.g., MMA), and structural units derived from two polymerizable vinyl monomers other than the at least one polymerizable acrylate monomer (e.g., other than MMA).

In certain aspects, the polymer matrix may comprise structural units derived from styrene, structural units derived from acrylonitrile, and structural units derived from methyl methacrylate, wherein the polymer matrix can have Structure IV:

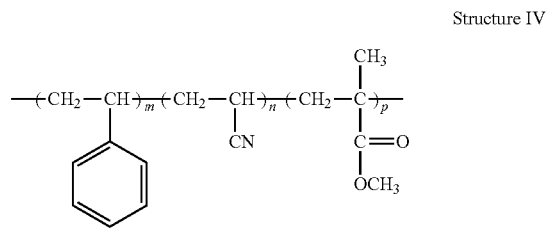

Structure IV wherein the structural units derived from styrene (repeated m times) are present in the polymer matrix in an amount of from about 30 wt. % to about 80 wt. %, or from about 35 wt. % to about 60 wt. %, or from about 38 wt. % to about 42 wt. %; wherein the structural units derived from acrylonitrile (repeated n times) are present in the polymer matrix in an amount of from about 10 wt. % to about 40 wt. %, or from about 20 wt. % to about 30 wt. %, or from about 23 wt. % to about 26 wt. %; and wherein the structural units derived from methyl methacrylate (repeated p times) are present in the polymer matrix in an amount of from about 10 wt. % to about 40 wt. %, or from about 20 wt. % to about 40 wt. %, or from about 33 wt. % to about 36 wt. %.

As an example, the polymer matrix can comprise from about 30 wt. % to about 40 wt. %, or from about 31 wt. % to about 39 wt. %, or from about 32.5 wt. % to about 37.5 wt. % structural units derived from methyl methacrylate (MMA), from about 35 wt. % to about 45 wt. %, or from about 36 wt. % to about 44 wt. %, or from about 37.5 wt. % to about 42.5 wt. % structural units derived from styrene, and from about 20 wt. % to about 30 wt. %, or from about 21 wt. % to about 29 wt. %, or from about 22.5 wt. % to about 27.5 wt. % structural units derived from acrylonitrile; and wherein the concentration of the ionic liquid in the polymeric piezoelectric composite ranges from about 1 wt. % to about 10 wt. %, or from about 4 wt. % to about 6 wt. %.

The polymer matrix can be characterized by a number average molecular weight ($M_n$) of from about 200,000 grams per mole (g/mol) or Dalton (Da) to about 300,000 Da, or from about 210,000 Da to about 290,000 Da, or from about 220,000 Da to about 275,000 Da, as measured by gel permeation chromatography (GPC), using a polystyrene standard.

The polymer matrix may be characterized by a molecular weight distribution (MWD), also known as a polydispersity index PDI, of from about 1 to about 5, or from about 1.5 to about 4, or from about 2 to about 3, as determined by gel permeation chromatography (GPC).

In some aspects, a hydrogen bonded polymeric piezoelectric composite as disclosed herein comprise a polymer matrix comprising structural units derived from at least one polymerizable vinyl monomer and a polymerizable co-monomer; wherein the at least one polymerizable vinyl monomer comprises an alkyl methacrylate, and wherein the polymerizable co-monomer comprises a hydroxyalkyl methacrylate. Accordingly, the polymer matrix may comprise from about 85 wt. % to about 95 wt. %, or from about 87.5 wt. % to about 92.5 wt. %, or from about 88 wt. % to about 92 wt. % structural units derived from methyl methacrylate (MMA), and from about 5 wt. % to about 15 wt. %, or from about 7.5 wt. % to about 12.5 wt. %, or from about 8 wt. % to about 12 wt. % structural units derived from 2-hydroxyethyl methacrylate (HEMA); and the concentration of the ionic liquid in the polymeric piezoelectric composite may range from about 1 wt. % to about 10 wt. %, or from about 4 wt. % to about 6 wt. %.

A hydrogen bonded polymeric piezoelectric composite as disclosed herein may comprise a polymer matrix comprising about 90 wt. % structural units derived from methyl methacrylate (MMA), and about 10 wt. % structural units derived from 2-hydroxyethyl methacrylate (HEMA); a piezoelectric ceramic filler, and an ionic liquid in an amount of 5 wt. % in the polymeric piezoelectric composite.

Piezoelectric Additive

Piezoelectric elements are used as sensors, actuators, and energy harvesting devices. Piezoelectric materials compress or expand when subjected to an electric potential, or conversely, produce a voltage in response to an applied mechanical force. The piezoelectric polymer composite of the present disclosure may comprise a piezoelectric filler. The piezoelectric filler may have a piezoelectric sensitivity or a piezoelectric constant $d_{33}$ of at least 10 pC/N. Exemplary piezoelectric fillers include piezoelectric lead zirconate titanate (PZT) and barium titanate (BT) ceramics. The piezoelectric constant $d_{33}$ of PZT and BT are very high (about 100 to 600 pC/N). These ceramic fillers also have a high dielectric constant (about 500 to 5000).

In aspects of the present disclosure, the piezoelectric filler may have a minimum $d_{33}$ of 100 pC/N.

Other non-ceramic piezoelectric materials may be useful as the piezoelectric additive of the present disclosure. Exemplary organic piezoelectric materials include, but are not limited to, tartaric acid and vinylidene fluoride polymers or copolymers thereof.

Typical examples of the ceramic piezoelectric fillers that are useful in the present disclosure may include, but are not limited to, lead zirconate titanate (PZT), lead niobium titanate (PNT), and lead scandium niobium titanate (PSNT). Piezoelectric fillers may further include but are not limited to, lead zirconate titanate (PZT), lead niobium titanate (PNT), and lead scandium niobium titanate (PSNT), lead metaniobate, barium titanate, lead titanate, bismuth scandate $BiScO_3$, KNN-Li (KNN=$K_{0.5}Na_{0.5}NbO_3$), bismuth sodium niobate (BNT), KNLN, and $(K_{0.5}Na_{0.5})_{1-x}Li_xNbO_3$ potassium sodium niobate (KNaNb)$O_3$ (KNN), potassium lithium sodium niobate (KLi)(NaNb)$O_3$ (KLNN), hydroxyapatite, apatite, lithium sulfate monohydrate, sodium bismuth titanate, quartz, an organic material (preferably, tartaric acid or vinylidene fluoride polymer fibers), or combinations thereof. In one particular example, not intended to limit the disclosure, the percent is about 5 wt % to about 90 wt. % of PZT based on the total weight of the monomer or precursor polymer.

In some aspects the piezoelectric filler comprises barium titanate (BT). In further aspects the piezoelectric filler is lead based, such as but not limited to lead zirconium titanate (PZT). In various examples, the particle size for BT may be less than 2000 nm. The particle size for PZT may be from 2000 nm to 4000 nm.

In various aspects, the piezoelectric filler is a particulate dispersed throughout the polymer resin matrix. The size of the piezoelectric filler may vary. For example, the piezoelectric filler may have a size of a few micrometer or the piezoelectric filler may be nanoparticles or nanomolecular size. For example, the piezoelectric filler may have a particle size less than 2000 nm.

Properties of the polymer composite comprising the polymer resin matrix and piezoelectric filler may be affected by the orientation and percolation of the piezoelectric particles in the polymer matrix, as well as the intrinsic properties of the piezoelectric filler particles. Accordingly, the desired particulate size of the piezoelectric filler may depend upon the resin and type of piezoelectric filler used. For example, piezoelectric filler having a spherical particulate shape may be more useful in the polymer composite at microparticle size range. The microparticle size range may be preferred because a lower loading may be used to get percolation in a single direction. In the present disclosure, as the microstructures are relatively small, it may be desirable that the piezoelectric filler particulate is smaller than the dimensions of the microstructures. As such, nanoparticle-sized piezoelectric filler may be more suitable.

According to various examples, the dielectric constant of the polymer matrix (passive) is about 3 and the dielectric constant for the additive is greater than 100.

Ionic Additive

In various aspects of the present disclosure, the disclosed polymeric piezoelectric composite may comprise a polymer matrix, a piezoelectric ceramic filler, and an ionic additive. It is to be understood that the methods disclosed herein can be used in conjunction with any suitable method of making and/or using a dielectric polymeric composition or a polymeric piezoelectric composite comprising a polymer matrix and any suitable ionic additive compatible with the methods and materials disclosed herein (such as, for example, a metal salt of an unsaturated carboxylic acid).

As an example, the ionic additive is an ionic liquid. The ionic additive as a liquid at the polymerization conditions or processing conditions may enhance dispersion within the matrix. For example, a solid ionic additive may not be dispersed as uniformly within the polymer matrix. The ionic liquid may comprise an organic cation and a balancing anion. The ionic liquid may have the general structure of: $Z^+ X^-$, wherein $Z^+$ is the organic cation, and $X^-$ is the balancing anion. Generally, ionic liquids are salts that are in a liquid state at temperatures below 100° C. The ionic liquid may have at least one organic component (usually the cation). Without wishing to be bound to a particular theory, ionic liquids may suffer from poor coordination, and may display a delocalized charge in the organic component (e.g., organic cation component), which in turn prevents the formation of a stable crystal lattice, and thus the ionic liquid remains in a liquid state at temperatures below 100° C.

In some examples, the organic cation ($Z^+$) may be an onium cation. Generally, onium cations refer to cations derived by addition of a proton to a mononuclear parent hydride of the nitrogen, chalcogen (such as, for example, elements in group 16 of the periodic table, such as oxygen (O), sulfur (S)), and halogen families. Onium cations, along with their counter-ions, form onium compounds. In a specific example, the ionic liquid comprises an onium compound.

Non-limiting examples of onium cations suitable for use as $Z^+$ in the ionic liquids disclosed herein may include a phosphonium cation, a sulfonium cation, a 5-membered heterocyclic ring cation, a 6-membered heterocyclic ring cation, and the like, or combinations thereof wherein each of the 5-membered heterocyclic ring cation and the 6-membered heterocyclic ring cation may have from 1 to 3 heteroatoms as ring members selected from the group consisting of nitrogen, oxygen, sulfur, and combinations thereof.

In an aspect, at least one heterocyclic ring atom of the 5-membered heterocyclic ring cation and/or the 6-membered heterocyclic ring cation can be substituted with a substituent group comprising one or more halides, oxygen, nitrogen, sulfur, phosphorus, alkanes, esters, ethers, ketones, carbonyls, alkoxy alkanes, alkenes, aryls, nitriles, silanes, sulfones, thiols, phenols, hydroxyls, amines, imides, aldehydes, carboxylic acids, alkynes, carbonates, anhydrides, and the like, or combinations thereof. In a further aspect, the carbon or hydrogen atoms in the substituent group can be further substituted with one or more halides, oxygen, nitrogen, sulfur, phosphorus, alkanes, esters, ethers, ketones, carbonyls, alkoxy alkanes, alkenes, aryls, nitriles, silanes, sulfones, thiols, phenols, hydroxyls, amines, imides, aldehydes, carboxylic acids, alkynes, carbonates, anhydrides, and the like, or combinations thereof.

In some examples, the onium cation can comprise a substituted or unsubstituted imidazolium cation, a substituted or unsubstituted N-alkyl pyridinium cation, a substituted or unsubstituted N,N-dialkyl pyrrolidinium cation, a substituted or unsubstituted piperidinium cation, a substituted or unsubstituted morpholinium cation, a sulfonium cation (e.g., a trialkyl sulfonium cation), a phosphonium cation (e.g., a tetraalkyl phosphonium cation and/or an aryl phosphonium cation), and the like, or combinations thereof.

The onium cation suitable for use as $Z^+$ in the ionic liquids disclosed herein may comprise a substituted or unsubstituted imidazolium cation having Structure V:

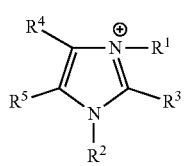

Structure V wherein $R^1$, $R^2$, $R^3$, $R^4$, and $R^5$ may each independently be hydrogen, or a linear or branched $C_1$ to $C_{20}$ alkyl group, alternatively a linear or branched $C_1$ to $C_{10}$ alkyl group, alternatively a linear or branched $C_2$ to $C_8$ alkyl group, or alternatively a linear or branched $C_3$ to $C_5$ alkyl group.

In some aspects, $R^1$ can be methyl, and $R^2$ may be a $C_1$ to $C_{10}$ alkyl group, alternatively a $C_2$ to $C_8$ alkyl group, or alternatively a $C_3$ to $C_5$ alkyl group. For example, $R^2$ may be a $C_3$ to $C_5$ alkyl group; for example $R^2$ can be a $C_4$ alkyl group, such as a butyl group.

In an example the onium cation suitable for use as $Z^+$ in the ionic liquids disclosed herein may comprise 1-butyl-3-methylimidazolium cation. Non-limiting examples of balancing anions suitable for use as $X^-$ in the ionic liquids disclosed herein may include a halide, a nitrate, a phosphate (such as, for example, a halogenated phosphate, hexafluorophosphate), a chlorate, a sulfate, an alkyl sulfate, a borate (such as, for example, tetrafluoroborate), a sulfonate (such as, for example, trifluoromethanesulfonate), a carboxylate, an acetate (such as, for example, trifluoromethaneacetate), a dicyanamide anion, a phosphazine anion, an imide anion (such as, for example, a bis(trifluoromethanesulfonyl)imide anion, a bis(pentafluoroethanesulfonyl)imide anion), and the like, or combinations thereof. For example, the balancing anion suitable for use as $X^-$ in the ionic liquids can comprise hexafluorophosphate. The ionic liquid may comprise 1-butyl-3-methylimidazolium hexafluorophosphate ($BMImPF_6$).

In various aspects, the ionic liquid may be present in the mixture to be subjected to in-situ polymerization conditions in an amount of from about 0.5 wt. % to about 30 wt. %, or from about 1 wt. % to about 10 wt. %, or from about 0.01 wt. % to about 6 wt. %, or from about 0.01 wt. % to about 5 wt. %, or from about 4 wt. % to about 6 wt. %. In further aspects, the ionic liquid can be present in the mixture to be subjected to in-situ polymerization conditions in an amount of about 5 wt. % based on the weight of the monomer or precursor polymer.

The ionic liquid, and the monomer and/or co-monomer and/or precursor polymer may be present in the mixture to be subjected to in-situ polymerization conditions in a weight ratio of ionic liquid to monomer (and/or co-monomer) and/or precursor polymer of from about 1:199 (i.e., 0.5 wt. % ionic liquid and 99.5 wt. % monomer and/or co-monomer) to about 3:7 (i.e., 30 wt. % and 70 wt. %), or from about 1:99 (i.e., 1 wt. % and 99 wt. %) to about 1:9 (i.e., 10 wt. % and 90 wt. %), or from about 1:24 (i.e., 4 wt. % and 96 wt. %) to about 3:47 (i.e., 6 wt. % and 94 wt. %), or from about 1:19 (i.e., 5 wt. % ionic liquid and 95 wt. %). As an example, the ionic liquid may be miscible with the at least one polymerizable vinyl monomer and/or the polymerizable co-monomer, in a weight ratio of ionic liquid to monomer and/or co-monomer and/or precursor polymer of from about 1:199 to about 3:7.

As provided herein, the piezoelectric composite may comprise a polymer resin matrix, the ionic liquid, the piezoelectric ceramic filler, unreacted vinyl monomer, and optionally unreacted co-monomer; wherein the polymer matrix comprises polymerized vinyl monomer, and optionally the crosslinking agent and/or polymerized co-monomer. The ionic liquid may be compatible or partially compatible with the polymer matrix.

Such compatibility may depend on certain characteristics including glass transition temperature $T_g$ or melting temperature $T_m$. Compatibility of the ionic liquid with the polymer matrix may be assessed visually, or by optical microscopy. For example, compatibility of the ionic liquid with the polymer matrix may be assessed by comparing the $T_g$ of the polymer matrix with the $T_g$ of the piezocomposite. Where the ionic liquid is compatible with the polymer matrix, the piezocomposite and/or precursor piezocomposite may be characterized by a single thermal transition temperature ($T_g$, and optionally $T_m$). As demonstrated herein, an ionic liquid compatible with polymer may contribute to a significant lowering of surface roughness. Conversely, when the ionic liquid is incompatible with polymer, its effect on surface roughness in not very prominent Without wishing to be bound to a particular theory, given the small amount of ionic liquid in the composition (disclosed examples include less than about 30 wt. %, and as low as 1 wt. %), as well as the small size of the ionic liquid molecules as compared to significantly larger polymer molecules that form the polymer matrix, in some cases the thermal transition of the ionic liquid may be undetectable (or, indistinguishable from the thermal transition of the polymer matrix), given the resolution limitations of the analytical method used for measuring the thermal transition (e.g., differential scanning calorimetry (DSC)).

In some aspects, the mixture to be subjected to in-situ polymerization conditions may consist essentially of or consist of the ionic liquid, the piezoelectric ceramic filler, the monomer or polymerizable precursor, and the free radical initiator. The ionic liquid may be miscible or partially miscible with the at least one polymerizable vinyl monomer. Additionally, the ionic liquid may be further miscible or partially miscible with the polymerizable co-monomer. As will be appreciated by one of skill in the art, and with the help of this disclosure, while the ionic liquid, and a monomer and/or co-monomer may be partially miscible over the entire range of possible mixing proportions, they are miscible over at least a portion of the range of proportions disclosed herein. Further, and as will be appreciated by one of skill in the art, and with the help of this disclosure, the ionic liquid, and the monomer and/or co-monomer may be selected such that they are miscible with each other at the proportions used for forming the mixture to be subjected to in-situ polymerization conditions. In an aspect, the ionic liquid as disclosed herein is miscible or partially miscible with the monomer and/or co-monomer as disclosed herein, wherein the ionic liquid can be present in the mixture to be subjected to in-situ polymerization conditions in an amount of from about 0.5 wt. % to about 30 wt. %.

Other Additives

The disclosed compositions can optionally comprise one or more additives conventionally used in the manufacture of molded thermoplastic parts with the proviso that the optional additives do not adversely affect the desired properties of the resulting composition. Mixtures of optional additives can also be used. Such additives may be mixed at a suitable time during the mixing of the components for forming the composite mixture. For example, the disclosed thermoplastic compositions can comprise one or more fillers, plasticizers, stabilizers, anti-static agents, flame-retardants, impact modifiers, colorant, antioxidant, and/or mold release agents. In one aspect, the composition further comprises one or more optional additives selected from an antioxidant, flame retardant, inorganic filler, and stabilizer.

Methods

A polymeric piezoelectric composite may be made by using any suitable methodology. A method of making a polymeric piezoelectric composite can comprise a step of subjecting a mixture comprising an ionic liquid and a monomer or polymerizable precursor to in-situ polymerization conditions to form a precursor dielectric polymeric composition. The mixture that is be subjected to in-situ polymerization conditions may be prepared by combining the ionic liquid, and the monomer or polymerizable precursor in any suitable order. For example, the ionic liquid may be added to the monomer or polymerizable precursor to form the mixture, wherein the mixture may be further agitated (e.g., stirred), for example to enable the formation of a homogeneous mixture (e.g., to facilitate the solubilization or dissolution of the ionic liquid and monomer or polymerizable precursor in each other). In further examples, the monomer or polymerizable precursor may be added to the ionic liquid to form the mixture, wherein the mixture can be further agitated (e.g., stirred), for example to enable the formation of a homogeneous mixture.

The method of making the disclosed polymeric piezoelectric composite may comprise subjecting a mixture comprising an ionic liquid, a piezoelectric ceramic filler, and a monomer or polymerizable precursor to in-situ polymerization conditions to form a polymeric piezoelectric composite. A method for forming the polymeric piezoelectric composite may comprise (a) subjecting a mixture comprising an ionic liquid, a piezoelectric ceramic filler, and a monomer or polymerizable precursor to in-situ polymerization conditions to form a precursor polymeric piezoelectric composite, (b) removing at least a portion of unreacted polymerizable vinyl monomer and optionally at least a portion of the unreacted polymerizable co-monomer from the precursor polymeric piezoelectric composite to form the polymeric piezoelectric composite.

The polymerization conditions (e.g., in-situ polymerization conditions) may be any suitable conditions that may initiate free radical polymerization in-situ (e.g., free radical polymerization in the mixture of ionic liquid and monomer or polymerizable precursor). Without wishing to be bound to any particular theory, the free radical polymerization of the vinyl monomers in the presence of the ionic liquid may form a polymer matrix (e.g., continuous phase) that encapsulates or incorporates an ionic liquid dispersed phase and piezoelectric ceramic filler. The in-situ polymerization of the monomer or polymerizable precursor (e.g., polymerizable vinyl monomer, polymerizable co-monomer) may occur in the absence of a solvent other than the ionic liquid (i.e., a solvent other than the ionic liquid is not introduced into the mixture), owing to the ionic liquid being miscible with the monomers and co-monomers at the mixture proportions used herein.

The mixture to be subjected to in-situ polymerization conditions may comprise at least one polymerizable vinyl monomer and/or the polymerizable co-monomer dissolved in the ionic liquid, before subjecting the mixture to in-situ polymerization conditions. For example, where the at least one polymerizable vinyl monomer and/or the polymerizable co-monomer are gases at normal conditions (e.g., atmospheric pressure, room temperature), the monomer and/or comonomer may be dissolved in the ionic liquid by bubbling the monomer and/or comonomer through the ionic liquid. In a further example, where the at least one polymerizable vinyl monomer and/or the polymerizable co-monomer are liquids at normal conditions (e.g., atmospheric pressure, room temperature), the monomer and/or comonomer can be dissolved in the ionic liquid by contacting the monomer and/or comonomer with the ionic liquid in any suitable manner (e.g., addition of one liquid to another) Vinyl monomer miscibility with ionic liquids is described in more detail in *J. Am. Chem. Soc.,* 2005, vol. 127, pp. 4976-4983; which is incorporated by reference herein in its entirety.

In an aspect, the polymerization conditions may comprise a temperature (e.g., polymerization temperature) ranging from about 30° C. to about 100° C., or from about 40° C. to about 95° C., or from about 50° C. to about 90° C., or from about 75° C. to about 85° C. The polymerization temperature may be applied for a time period of from about 4 hours (h) to about 24 h, or from about 6 h to about 20 h, or from about 8 h to about 16 h, or from about 10 h to about 14 h.

In an aspect, the polymerization conditions may comprise an oxygen-free atmosphere (e.g., a substantially oxygen-free atmosphere), as oxygen can inhibit free radical polymerization of vinyl monomers. Where the polymerizable vinyl monomer is a liquid, an inert gas (e.g., nitrogen, argon, helium, etc.) may be bubbled through the liquid monomer to remove the oxygen. For purposes of the disclosure herein, an oxygen-free atmosphere refers to an atmosphere having less than 100 ppm oxygen.

In some aspects, the method of making a polymeric piezoelectric composite as disclosed herein may comprise a step of removing at least a portion of unreacted polymerizable vinyl monomer from the precursor polymeric piezoelectric composite to form the polymeric piezoelectric composite. In an example, the precursor polymeric piezoelectric composite may comprise unreacted polymerizable vinyl monomer in an amount of equal to or greater than about 10 ppm, or equal to or greater than about 25, or equal to or greater than about 50 ppm, or from about 10 ppm to about 50 ppm, or from about 15 ppm to about 45 ppm, or from about 20 ppm to about 40 ppm; wherein an amount of unreacted polymerizable vinyl monomer in the polymeric piezoelectric composite is measured via high performance liquid chromatography (HPLC). In a further example, the precursor polymeric piezoelectric composite may comprise unreacted polymerizable co-monomer in an amount of equal to or greater than about 10 ppm, or equal to or greater than about 25, or equal to or greater than about 50 ppm, or from about 10 ppm to about 50 ppm, or from about 15 ppm to about 45 ppm, or from about 20 ppm to about 40 ppm; wherein an amount of unreacted polymerizable co-monomer in the polymeric piezoelectric composite is measured via HPLC.

Where the precursor polymeric piezoelectric composite comprises unreacted polymerizable co-monomer and/or a crosslinking agent, the precursor polymeric piezoelectric composite may be used as a polymeric piezoelectric composite as disclosed herein without (i.e., prior to) removing at least a portion of the unreacted monomer and/or co-monomer.

Removing at least a portion of the unreacted polymerizable vinyl monomer from the precursor polymeric piezoelectric composite may comprise heating the precursor polymeric piezoelectric composite to a first temperature. Subsequent to heating the precursor polymeric piezoelectric composite to the first temperature, the precursor polymeric piezoelectric composite may be heated to a second temperature of from about 70° C. to about 200° C., or from about 75° C. to about 175° C., or from about 80° C. to about 150° C.; for a second time period of from about 30 min to about 6 h, or from about 1 h to about 5 h, or from about 2 h to about 4 h; wherein the second temperature is greater than the first temperature.

In some aspects, heating the precursor polymeric piezoelectric composite to the second temperature may be done step-wise. In such aspects, the precursor polymeric piezoelectric composite can be heated to an initial temperature in the range of from about 70° C. to about 200° C., wherein the initial temperature can be held for an initial time period of from about 30 min to about 6 h; followed by heating the precursor polymeric piezoelectric composite to an intermediary temperature in the range of from about 70° C. to about 200° C., wherein the intermediary temperature can be held for an intermediary time period of from about 30 min to about 6 h, and wherein the intermediary temperature can be greater than the initial temperature. Heating the precursor polymeric piezoelectric composite to the second temperature can further comprise one or more additional heating steps.

The second temperature may be lower than a boiling point of the ionic liquid. In some examples, the second temperature can be greater than a boiling point of the polymerizable vinyl monomer and the polymerizable co-monomer. Without wishing to be limited by theory, by heating the precursor polymeric piezoelectric composite to a temperature that is greater than the boiling point of the unreacted monomer and unreacted co-monomer, the unreacted monomer and unreacted co-monomer will change state from a liquid state into a gaseous state and diffuse out of the precursor polymeric piezoelectric composite, thereby forming the polymeric piezoelectric composite.

As provided herein, in evaluating the piezoelectric properties of the polymeric piezoelectric composite, the composite may be poled. Various poling methods are applicable for the composites of the present disclosure. These include DC poling, corona poling, plasma poling, pulse poling, and poling under more varied voltage conditions (which may comprise various combinations of DC, AC, pulse, and corona poling) at either a single temperature or a range of temperatures. Corona discharge is a partial breakdown of air, typically at atmospheric pressure, and is initiated by a discharge in an inhomogeneous electric field. Corona discharge has been used to pole films of piezoelectric materials to enhance their piezoelectric properties. A specific method of poling is DC poling in a thermostatically temperature-controlled silicon oil bath, which is the method frequently used by investigators of piezoelectric materials.

In order to ensure most complete and rapid poling, the maximum poling field should be preferably as high a field as can be applied without causing dielectric breakdown of the composite. Conventional polymeric piezoelectric composites may have a poling voltage of 60 kilovolts per millimeter (kV/mm) (such as for PVDF), while the disclosed composites have a poling voltage of 10 kV/mm, enabling them for broader use.

In some aspects, the poling temperature is maintained below the Curie temperature of the composite. At temperatures above the Curie temperature, a material loses its piezoelectric properties.

Unless otherwise expressly stated, it is in no way intended that any method set forth herein be construed as necessarily requiring that its steps be performed in a specific order. Where a method claim does not specifically state in the claims or descriptions that the steps are to be limited to a specific order, it is no way intended that an order be inferred, in any respect.

Properties and Articles

The disclosed polymeric piezoelectric composites may be useful in a diverse array of applications. The disclosed polymeric piezoelectric composite may provide: 1) a reasonably good piezoelectric constant with a passive polymer as matrix, 2) thin film forming ability, both free-standing and supported film on the substrate, 3) simple and environmentally friendly process of making the polymeric piezoelectric composites from commercially available monomers, and 4) low temperature processability.

In an aspect, a polymeric piezoelectric composite as disclosed herein may comprise (a) a polymer matrix, wherein the polymer matrix comprises structural units derived from at least one polymerizable vinyl monomer; (b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the polymeric piezoelectric composite ranges from about 0.5 wt. % to about 30 wt. %, or from about 1 wt. % to about 10 wt. %, or from about 4 wt. % to about 6 wt. %; (c) a piezoelectric ceramic filler, and (d) less than about 10 ppm, or less than about 5 ppm, or less than about 1 ppm of unreacted polymerizable vinyl monomer, wherein an amount of unreacted polymerizable vinyl monomer in the polymeric piezoelectric composite is measured via HPLC. In various aspects, the polymeric piezoelectric composite may comprise a polymeric phase comprising the polymer matrix having dispersed therein an ionic liquid dispersed phase and piezoelectric ceramic filler.

The ionic liquid may impart flexibility to the polymeric piezoelectric composite such that the polymeric piezoelectric composite may exhibit a storage modulus (G') that is lower than the G' of the polymeric piezoelectric composite in the absence of the ionic liquid. Storage modulus may be measured in accordance with ASTM D4440-15. Small molecules, such as ionic liquid molecules (by comparison with significantly larger polymer molecules that form the polymer matrix), may act as a plasticizer within the polymeric piezoelectric composite, thereby improving the flexibility of the polymeric piezoelectric composite.

In some aspects, the polymeric piezoelectric composite may be characterized by a storage modulus that is decreased by equal to or greater than about 25%, or equal to or greater than about 30%, or equal to or greater than about 40%, or equal to or greater than about 50% when compared to the storage modulus of the polymeric piezoelectric composite in the absence of the ionic liquid.

In an aspect, the piezocomposite as disclosed herein can be characterized by a dielectric constant ($\varepsilon$) at 1 kHz of from about 30 to about 120, or from about 40 to about 100, or from about 50 to about 80.

In a further aspect, the polymeric piezoelectric composite can be used to provide any desired shaped, formed, or molded articles. Articles comprising the piezoelectric composite may be formed by a number of different techniques, including but not limited to, imprinting lithography, e-beam lithography, ion beam lithography, micro-contact structures, 3-D printing, or (nano)injection molding. As noted above, the disclosed compositions are particularly well suited for use in the manufacture of electronic components and devices. As such, according to some aspects, the disclosed compositions can be used to form articles such as sensors, actuators, and the like.

Shaped, formed, or molded articles including the thermoplastic compositions are also provided. The thermoplastic compositions can be molded into useful shaped articles by a variety of means such as injection molding, extrusion, rotational molding, blow molding and thermoforming to form articles such as, for example, personal computers, notebook and portable computers, cell phone antennas and other such communications equipment, medical applications, radio frequency identifications (RFID) applications, automotive applications, and the like.

Aspects

The present disclosure comprises at least the following aspects.

Aspect 1. A composite comprising:
a polymer matrix formed from one or more of a monomer or a precursor polymer; and
a dispersion of a piezoelectric ceramic filler and an ionic additive within the polymer matrix,
wherein the polymer is synthesized in-situ.

Aspect 2. The composite of Aspect 1, wherein the composite exhibits a $d_{33}$ of at least 1 pC/N when measured using a piezo meter.

Aspect 3. The composite of Aspect 1, wherein the piezoelectric ceramic filler is present in an amount of from 5 wt. % to about 90 wt. % based on the total weight of the one or more of the monomer or the precursor polymer.

Aspect 4. The composite of Aspect 1, wherein the ionic additive is present in an amount of less than about 4 wt. % based on the total weight of the one or more of the monomer or the precursor polymer.

Aspect 5. The composite of Aspect 1, wherein the piezoelectric ceramic filler comprises barium titanate.

Aspect 6. The composite of Aspect 1, wherein the piezoelectric ceramic filler has a particle size less than 4000 nm.

Aspect 7. The composite of Aspect 1, wherein the ionic additive is present in an amount of less than 4 wt. % based on the total weight of the composite.

Aspect 8. The composite of Aspect 1, wherein the monomer or precursor monomer is a vinylic monomer or vinylic precursor monomer.

Aspect 9. The composite of Aspect 1, wherein the monomer or precursor monomer is capable of forming a hydrogen bonded network.

Aspect 10. The composite of Aspect 1, wherein the one or more of a monomer or precursor polymer comprises methacrylate monomer, a 2-hydroxyethyl methacrylate, or methyl acrylate, ethyl acrylate, butyl acrylate, tetraethylene glycol diacrylate, or a combination thereof.

Aspect 11. The composite of Aspect 1, wherein the ionic additive comprises an organic cation and a balancing anion.

Aspect 12. The composite of Aspect 1, wherein the ionic additive is a liquid.

Aspect 13. The composite of Aspect 1, wherein the ionic additive is 1-butyl-3-methylimidazolium hexafluorophosphate.

Aspect 14. The composite of Aspect 1, wherein the ionic additive is compatible with the one or more of a monomer or precursor polymer.

Aspect 15. The composite of Aspect 1, wherein the composite is an 0-3 composite.

Aspect 16. The composite of Aspect 1, wherein the composite has a surface roughness of less than 10 μm when measured using a profilometer.

Aspect 17. The composite of Aspect 1, wherein the piezoelectric ceramic filler has a $d_{33}$ of at least 100 pC/N.

Aspect 18. A composite comprising:
from about 5 wt. % to about 90 wt. % of a piezoelectric ceramic filler;
a polymer resin matrix derived from one or more of a monomer or a precursor polymer; and
less than about 4 wt. % based of an ionic additive, wherein the composite exhibits a $d_{33}$ of at least 1 pC/N when tested using a piezometer, and
wherein the composite exhibits a surface roughness of less than 10 μm,
wherein the weight percent of the piezoelectric ceramic filler and the weight percent of the ionic additive are based on the total weight of the one or more of the monomer or the precursor polymer.

Aspect 19. The composite of Aspect 17, wherein the thermoplastic resin is derived from one or more of a vinylic monomer or a vinylic precursor polymer.

Aspect 20. A method of forming a polymer composite, comprising:
combining, via in-situ dispersion
a piezoelectric ceramic filler,
a monomer or a precursor polymer, and
less than 4 wt. % of an ionic additive compatible with the monomer or the precursor polymer; and
reacting the monomer or the precursor polymer to form the polymer composite including the piezoelectric ceramic filler and the ionic additive,
wherein the monomer or precursor polymer forms a hydrogen bonded network, and
wherein the combined weight percent value of all components does not exceed 100 wt. %, and all weight percent values are based on the total weight of the one or more of the monomer or the precursor polymer.

EXAMPLES

The following examples are put forth so as to provide those of ordinary skill in the art with a complete disclosure and description of how the methods, devices, and systems disclosed and claimed herein are made and evaluated and are intended to be purely exemplary and are not intended to limit the disclosure. Best efforts have been made to ensure accuracy with respect to numbers (e.g., amounts, temperature, etc.), but some errors and deviations should be accounted for. Unless indicated otherwise, weight percent, temperature is in degrees Celsius (° C.) (ambient temperature unless specified otherwise), and pressure is at or near atmospheric.

Samples 1-2: Synthesis of PMMA polymeric piezoelectric composites. In a glass reactor, 20 grams (g) (0.2 moles) of methyl methacrylate (MMA) was added under the nitrogen atmosphere. The flask was purged with nitrogen for 30 min. Subsequently, barium titanate (BT) was added slowly. After stirring the mixture at 500 rpm using a magnetic stirrer for 1 hour (h), the initiator, azobisisobutyronitrile (AIBN) (0.2 wt %), dissolved in MMA, was injected into the flask. The bulk polymerization was continued at 60° C., by stirring the reaction mixture at 500 rpm for 3.5 h under the nitrogen atmosphere. The resulting partially polymerized viscous reaction mixture was casted into a thin film using doctor blade on to a glass substrate, subsequently kept in the oven at 60° C. under nitrogen for 24 h to enable further polymerization. The films were thoroughly dried for the removal/reaction of unreacted monomers. The compositions of the polymeric piezoelectric composites synthesized following the procedure mentioned above are provided in Table 1. The molecular weight of the polymeric piezoelectric composites is summarized in Table 2.

Samples 3-5: Synthesis of PMMA copolymer polymeric piezoelectric composites. In a glass reactor, MMA monomer and the acrylate comonomer (2-hydroxyethyl methacrylate (HEMA) or methyl acrylate (MA)) was introduced under the nitrogen atmosphere. The feed composition of the monomers is also indicated in Table 1. The flask was purged with nitrogen for 30 min. Subsequently, BT was added slowly After stirring the mixture at 500 rpm using a magnetic stirrer for 1 h, the initiator, AIBN (0.2 wt %) dissolved in MMA, was injected into the flask. The bulk polymerization was continued at 60° C., by stirring the reaction mixture at 500 rpm for 2.5-3.5 h under the nitrogen atmosphere. The resulting partially polymerized viscous reaction mixture was casted into a thin film using doctor blade on to a glass substrate, subsequently kept in the oven at 60° C. under nitrogen for 24 h to enable further polymerization. The films were thoroughly dried for the removal/reaction of unreacted monomers. The compositions of the polymeric piezoelectric composites synthesized following the procedure mentioned above are provided in Table 1. The molecular weight of the polymeric piezoelectric composites is summarized in Table 2.

Samples 6-9: Synthesis of PMMA ionic polymeric piezoelectric composites. In a glass reactor, 20 g (0.2 moles) of MMA was added under the nitrogen atmosphere. After the addition of the monomer, the ionic liquid, 1-butyl-3-methylimidazolium hexafluorophosphate (BMImPF$_6$) was introduced under stirring at 500 rpm using a magnetic stirrer, the feed composition indicated in Table 1. The flask was purged with nitrogen for 30 min. Subsequently, BT was added slowly. After stirring the mixture for 1 h at 500 rpm using a magnetic stirrer, the initiator, AIBN (0.2 wt %), dissolved in MMA, was injected into the flask. The bulk polymerization was continued at 60° C., by stirring the reaction mixture at 500 rpm for 2.5 h under the nitrogen atmosphere. The resulting partially polymerized viscous reaction mixture was casted into a thin film using doctor blade on to a glass substrate, subsequently kept in the oven at 60° C. under nitrogen for 24 h to enable further polymerization. The films were thoroughly dried for the removal/reaction of unreacted monomers. The compositions of the polymeric piezoelectric composites synthesized following the procedure mentioned above are provided in Table 1. The molecular weight of the polymeric piezoelectric composites is summarized in Table 2. The ionic polymeric piezoelectric composites can form free standing film, a representative example is shown in FIG. 1 for 30 wt % barium titanate loading.

Samples 10-15: Synthesis of PMMA copolymer ionic polymeric piezoelectric composites. In a glass reactor, MMA and the acrylate comonomer (HEMA/MA) were added under the nitrogen atmosphere. After the addition of the monomers, the ionic liquid, BMImPF6 was introduced under stirring at 500 rpm using a magnetic stirrer, the feed composition indicated in Table 1. The flask was purged with nitrogen for 30 min. Subsequently, BT was added slowly. After stirring the mixture at 500 rpm using a magnetic stirrer for 1 h, the initiator, AIBN (0.2 wt %) dissolved in MMA, was injected into the flask. The bulk polymerization was continued at 60° C. by stirring the reaction mixture at 500 rpm for 3-4 h under the nitrogen atmosphere. The resulting partially polymerized viscous reaction mixture was casted into a thin film using doctor blade on to a glass substrate, subsequently kept in the oven at 60° C. under nitrogen for 24 h to enable further polymerization. The films were thoroughly dried for the removal/reaction of unreacted monomers. The compositions of the polymeric piezoelectric composites synthesized following the procedure mentioned above are provided in Table 1. The molecular weight of the polymeric piezoelectric composites is summarized in Table 2.

TABLE 1

Polymeric piezoelectric composites.

| Sample no | Monomer | Monomer feed composition (wt %) | BMImPF$_6$ content (wt %) | Type of piezoelectric ceramic filler (particle size, nm) | Filler loading (wt %) |
| --- | --- | --- | --- | --- | --- |
| 1 | MMA | 100 | — | BT, <2000 nm | 5 |
| 2 | MMA | 100 | — | BT, 300 nm | 90 |
| 3 | MMA/HEMA | 90/10 | — | BT, 300 nm | 90 |
| 4 | MMA/MA | 70/30 | | BT, 300 nm | 90 |
| 5 | MMA/MA | 70/30 | | PZT | 90 |
| 6 | MMA | 100 | 1 | BT, <2000 nm | 5 |
| 7 | MMA | 100 | 5 | BT, <2000 nm | 5 |
| 8 | MMA | 100 | 2 | BT, 700 nm | 30 |
| 9 | MMA | 100 | 2 | BT, 300 nm | 90 |
| 10 | MMA/HEMA | 90/10 | 1 | BT, 700 nm | 30 |
| 11 | MMA/HEMA | 80/20 | 1 | BT, 700 nm | 30 |
| 12 | MMA/MA | 70/30 | 2 | BT, 700 nm | 30 |
| 13 | MMA/MA | 70/30 | 2 | BT, 700 nm | 90 |
| 14 | MMA/MA | 70/30 | 2 | BT, 300 nm | 90 |
| 15 | MMA/MA | 70/30 | 2 | PZT | 90 |

TABLE 2

Molecular weight and polydispersity index PDI of polymeric piezoelectric composites.

| Sample no. | Mn | PDI |
| --- | --- | --- |
| 1 | 274277 | 2.2 |
| 2 | 278274 | 2.06 |
| 3 | 169711 | 3.4 |
| 4 | 301763 | 2.05 |
| 5 | 348962 | 1.92 |
| 6 | 233450 | 2.3 |
| 7 | 281520 | 2.4 |
| 8 | 217467 | 2.4 |
| 9 | 233550 | 2.04 |
| 10 | 264180 | 2.4 |
| 11 | 419407 | 2.2 |
| 12 | 236125 | 2.4 |
| 13 | 270254 | 1.88 |
| 14 | 289488 | 2.05 |
| 15 | 316453 | 1.86 |

Surface roughness of polymeric piezoelectric composites. Atomic Force Microscopy (AFM) was employed to study the surface roughness of the polymeric piezoelectric composite films at 5 wt % barium titanate loading. Example 1 and 7 demonstrates that the ionic liquid reduces the surface roughness of the polymeric piezoelectric composite film (Table 3, FIG. 2). Scanning electron microscope images of example 1 and 7 shows that the presence of ionic liquid improves the dispersion of the piezoelectric ceramic particles in the polymeric piezoelectric composites (FIG. 2).

TABLE 3

Ionic liquid effect on surface roughness of polymeric piezoelectric composites.

| Example no. | Surface roughness (nm) |
| --- | --- |
| 1 | 26 |
| 7 | 6 |

Figure 3:
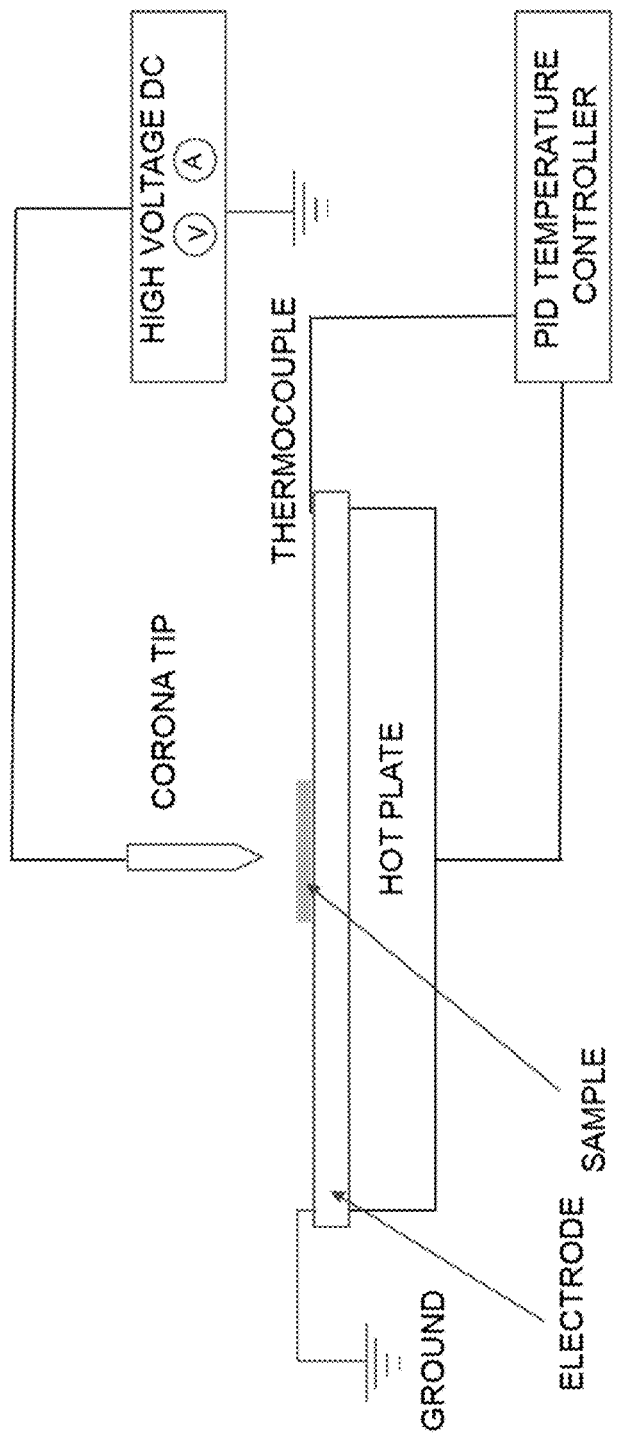
FIG. 3 shows a schematic view of the corona poling set up used for the poling of polymeric piezoelectric composite films.

Piezoelectric response of polymeric piezoelectric composites. The polymeric piezoelectric composite films were subjected to corona poling for the demonstration of piezoelectric response. The schematic diagram for corona poling unit is shown in FIG. 3. The basic elements of corona poling setup consist of four corona needles suspended within a cylinder. The film sample is placed on the preheated metallic plate directly below the needles. This plate is connected to the ground and also acts as electrode. The electrode is held at a potential slightly above zero via a small resistor connection to ground. By measuring the voltage drop across the resistor connected to the electrode, the current flowing from the electrode can be calculated. During poling, as the dipoles are aligned, fewer charges are able to move through the samples and thus the current flowing through the electrode will approach zero.

When a sufficiently high voltage is applied to the asymmetric electrodes such as needle tips and plate, corona discharge occurs, the air around the tips becomes ionized. The ions are deposited on the top surface of the film. The charges transferred by the ions, remain on the film surface generating a poling electric field between the sample surface and the ground, resulting in poling of the sample. The edges of the film sample are shielded from corona discharge by placing insulating material at the edges of the sample. Corona poling of the polymeric piezoelectric composites was carried out under the conditions detailed below; the needles were kept at high voltage (typically 10 kilovolts (KV)), poling temperature was 110° C. for BT based composites and 140° C. for PZT based composites, the electrode gap was 1 cm and poling time was 1 h. The samples were cooled to room temperature under the same applied voltage. The measurement results obtained after 48 h since poling.

Table 4, 5, 6 and 7 summarizes piezoelectric coefficient $d_{33}$ of the polymeric piezoelectric composites (obtained at ambient temperature using a Berlin court type $d_{33}$ meter, (PM300, Piezo Test, UK) at the frequency of 110 Hz, clamping force of 10N and oscillatory force 0.25N) after corona poling. Table 4 describes the effect of ionic liquid on $d_{33}$ of polymeric piezoelectric composites. Comparison of example 2 and example 9 shows that the presence of ionic liquid increases $d_{33}$ of the barium titanate containing PMMA piezo composite. P(MMA-co-MA) copolymer-based piezoelectric composites containing BT (example 4 and 14) show similar result. However, the influence of ionic liquid in P(MMA-co-MA) copolymer based piezoelectric composites containing PZT (example 5 and 15) is not significant.

TABLE 4

Ionic liquid effect on piezoelectric coefficient of polymeric piezoelectric composites.

| Example no. | $d_{33}$ (pC/N) |
| --- | --- |
| 2 | 13.8 |
| 4 | 17 |
| 5 | 20 |
| 9 | 18.6 |
| 14 | 20.9 |
| 15 | 20.1 |

Examples 2 and 3 shows the effect of the comonomer, HEMA on $d_{33}$. Examples 8, 10 and 11 demonstrate the effect HEMA on $d_{33}$ in presence of ionic liquid (Table 5). Examples 2, 4, 8 and 12 show the influence of the comonomer, MA on $d_{33}$ (Table 5). Comparison of Example 2 and 3 shows that the introduction of HEMA as comonomer in the PMMA matrix enhances $d_{33}$ significantly.

TABLE 5

Comonomer effect on piezoelectric coefficient of polymeric piezoelectric composites.

| Example no. | $d_{33}$ (pC/N) |
| --- | --- |
| 2 | 13.8 |
| 3 | 27 |
| 4 | 17 |
| 8 | 1.1 |
| 10 | 2.4 |
| 11 | 4.6 |
| 12 | 1.9 |

The results also show that both the comonomers, HEMA and MA have positive influence on the piezoelectric coefficient of the polymeric piezoelectric composites irrespective of the presence of ionic liquid.

Table 6 shows effect of particle size on $d_{33}$ of polymeric piezoelectric composites. A comparison of Examples 13 and 14 shows that a decrease in the particle size of the ceramic increases the piezoelectric coefficient significantly.

TABLE 6

Particle size effect on piezoelectric coefficient of polymeric piezoelectric composites.

| Sample no. | $d_{33}$ (pC/N) |
|---|---|
| 13 | 4.5 |
| 14 | 20.9 |

Examples 12 and 13 demonstrate the effect of BT loading on $d_{33}$ (Table 7). The result shows that $d_{33}$ improves with increasing filler loading.

TABLE 7

Filler loading effect on piezoelectric coefficient of polymeric piezoelectric composites.

| Example no. | $d_{33}$ (pC/N) |
|---|---|
| 12 | 1.9 |
| 13 | 4.5 |

It will be apparent to those skilled in the art that various modifications and variations can be made in the present disclosure without departing from the scope or spirit of the disclosure. Other aspects of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:

1. A composite comprising:
a thermoplastic polymer matrix synthesized in-situ from a monomer mixture or a precursor polymer in the presence of a dispersion of a piezoelectric ceramic filler and an ionic additive and in absence of an organic solvent, the monomer mixture or the precursor polymer comprising from about 70 weight percent (wt. %) to about 95 wt. % of an alkyl methacrylate and from about 5 wt. % to about 30 wt. % of a hydroxyalkyl methacrylate based on the total weight of the monomer mixture or the precursor polymer.

2. The composite of claim 1, wherein the composite exhibits a $d_{33}$ of at least 1 pC/N when measured using a piezo meter.

3. The composite of claim 1, wherein the piezoelectric ceramic filler is present in an amount of from about 5 wt. % to about 90 wt. % based on the total weight of the monomer mixture or the precursor polymer.

4. The composite of claim 1, wherein the ionic additive is present in an amount from about 0.01 wt. % to about 4 wt. % based on the total weight of the monomer mixture or the precursor polymer.

5. The composite of claim 1, wherein the piezoelectric ceramic filler comprises barium titanate having a particle size ranging from about 300 nm to less than about 700 nm.

6. The composite of claim 1, wherein the piezoelectric ceramic filler has a particle size less than 4000 nm.

7. The composite of claim 1, wherein the ionic additive comprises an organic cation and a balancing anion.

8. The composite of claim 1, wherein the ionic additive is a liquid.

9. The composite of claim 1, wherein the ionic additive is 1-butyl-3-methylimidazolium hexafluorophosphate.

10. The composite of claim 1, wherein the composite is an 0-3 composite.

11. The composite of claim 1, wherein the composite has a surface roughness of less than 10 μm when measured using a profilometer.

12. The composite of claim 1, wherein the piezoelectric ceramic filler has a $d_{33}$ of at least 100 pC/N.

13. A composite comprising:
a thermoplastic polymer resin matrix synthesized in-situ from a monomer mixture or a precursor polymer in the presence of from about 5 weight percent (wt. %) to about 90 wt. % of a piezoelectric ceramic filler and from about 0.01 wt. % to about 4 wt. % of an ionic additive, the monomer mixture or the precursor polymer comprising from about 80 wt. % to about 95 wt. % of an alkyl methacrylate and from about 5 wt. % to about 20 wt. % of a hydroxyalkyl methacrylate,
wherein the composite is formed as a solvent-free dispersion and exhibits a $d_{33}$ of at least 1 pC/N when tested using a piezometer, and wherein a surface of the composite exhibits a surface roughness of less than 10 μm, wherein the weight percent of each of the alkyl methacrylate, the hydroxyalkyl methacrylate, the piezoelectric ceramic filler, and the ionic additive are based on the total weight of the monomer mixture or the precursor polymer.

14. A composite comprising:
a thermoplastic acrylate copolymer matrix having a comonomer capable of forming hydrogen bonds, wherein the thermoplastic acrylate copolymer matrix is synthesized in-situ from about 70 weight percent (wt. %) to about 95 wt. % of an alkyl methacrylate and from about 5 wt. % to about 30 wt. % of 2-hydroxyethyl methacrylate in the presence of a dispersion of a piezoelectric ceramic filler and an ionic additive.

15. The composite of claim 14, wherein the piezoelectric ceramic filler comprises barium titanate having a particle size ranging from about 300 nm to less than about 700 nm.

* * * * *